(12) United States Patent
Yoshida et al.

(10) Patent No.: US 8,304,346 B2
(45) Date of Patent: Nov. 6, 2012

(54) ABRASIVE COMPOSITION AND METHOD FOR MANUFACTURING SEMICONDUCTOR INTEGRATED CIRCUIT DEVICE

(75) Inventors: Iori Yoshida, Tokyo (JP); Hiroyuki Kamiya, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/101,560

(22) Filed: May 5, 2011

(65) Prior Publication Data

US 2011/0212621 A1 Sep. 1, 2011

Related U.S. Application Data

(63) Continuation of application No. PCT/JP2009/067269, filed on Oct. 2, 2009.

(30) Foreign Application Priority Data

Nov. 10, 2008 (JP) ................ 2008-287404
Apr. 21, 2009 (JP) ................ 2009-102942

(51) Int. Cl.
*H01L 21/304* (2006.01)
*C09K 3/14* (2006.01)
*C09K 13/00* (2006.01)

(52) U.S. Cl. ............... 438/693; 252/79.1; 257/E21.23; 51/308

(58) Field of Classification Search ............... None
See application file for complete search history.

(56) References Cited

U.S. PATENT DOCUMENTS

| | | | |
|---|---|---|---|
| 2001/0003672 A1* | 6/2001 | Inoue et al. | 438/690 |
| 2003/0061766 A1* | 4/2003 | Vogt et al. | 51/308 |
| 2003/0157804 A1* | 8/2003 | Puppe et al. | 438/692 |
| 2007/0249167 A1* | 10/2007 | Zhang et al. | 438/692 |
| 2008/0261400 A1* | 10/2008 | Yoshida et al. | 438/692 |
| 2009/0250656 A1* | 10/2009 | Siddiqui et al. | 252/79.1 |
| 2010/0099259 A1* | 4/2010 | Takemiya et al. | 438/692 |

FOREIGN PATENT DOCUMENTS

| | | |
|---|---|---|
| JP | 2008-251939 | 10/2008 |
| WO | 2007/060869 | 5/2007 |
| WO | 2007/072918 | 6/2007 |

OTHER PUBLICATIONS

International Search Report issued Nov. 11, 2009 in PCT/JP09/067269 filed Nov. 24, 2009.

* cited by examiner

*Primary Examiner* — Allan Olsen
(74) *Attorney, Agent, or Firm* — Oblon, Spivak, McClelland, Maier & Neustadt, L.L.P.

(57) ABSTRACT

The present invention relates to a polishing composition used in a step of polishing until a barrier layer adjacent to a copper layer is exposed, in a pattern formation of polishing the copper layer provided on an insulating layer through the barrier layer thereby alternately forming a copper embedded wiring and the insulating layer, the polishing composition including: an alicyclic resin acid; a colloidal silica in which a content thereof in the polishing composition is from 0.1 to 1.5% by mass, an average primary particle size thereof is from 10 to 40 nm, an average secondary particle size thereof is from 30 to 80 nm, and (the average secondary particle size×the content) is in a range of from 10 to 40; and tetramethylammonium ion.

12 Claims, 3 Drawing Sheets

ABRASIVE COMPOSITION AND METHOD FOR MANUFACTURING SEMICONDUCTOR INTEGRATED CIRCUIT DEVICE

TECHNICAL FIELD

The present invention relates to a novel polishing composition suitably used for a semiconductor integrated circuit and the like.

BACKGROUND ART

In recent years, in response to the increase in needs to high integration of a semiconductor integrated circuit, various microfabrication techniques such as line thinning of a semiconductor element, multilayering of wiring and the like are developed. For this reason, needs to a novel polishing composition are great in Chemical Mechanical Polishing (hereinafter referred to as "CMP") relating to wiring formation. The polishing composition for CMP requires polishing having very high accuracy as compared with a merely mechanical polishing composition, and this necessitates very precise adjustment.

Specific needs to a novel polishing composition are prevention of the irregularity on the surface.

Multilayering of wiring forms a circuit and additionally forms a fresh circuit thereon using lithography. However, if the irregularity are present on the surface of a circuit which is to be an underlayer, the irregularity also appears on the surface of a circuit newly formed thereon, resulting in deviation from focus depth in lithography, and wiring cannot be formed in according with planning. Therefore, in the planning of a semiconductor integrated circuit in recent years, it is required that a surface on which a circuit has been formed is planarized with very high accuracy, thereby not giving an influence to the planarization of a surface of a layer thereon.

Furthermore, in quality, irregularity on the surface gives influence to electric characteristics of wiring. Therefore, irregularity should be suppressed as possible in order to suppress variation on quality.

For example, in a damascene method that simultaneously forms wiring of a circuit in planarizing a circuit-formed surface, a trench pattern for wiring is formed on an intended surface of a semiconductor integrated circuit device, and a metal having low specific resistance, such as aluminum and metallic copper, for forming wiring in the trench is formed so as to be embedded therein. The metal is first formed as a film on the surface by a plating method or a sputtering method. In many cases, the film is polished by CMP technique to remove the metal other than the wiring portion, thereby forming wiring corresponding to the trench. In such a case, the polished surface is simultaneously planarized.

Figure 1:
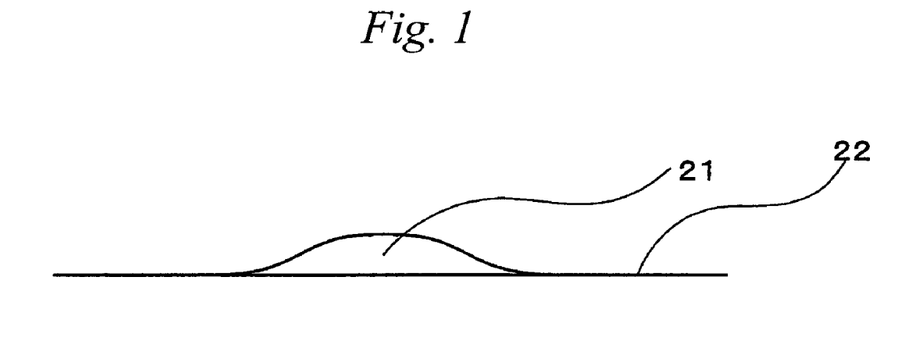
FIG. 1 is a cross-sectional view schematically showing a state that a portion having copper remaining is projected as compared with a portion free of copper remaining.
Figure 2:
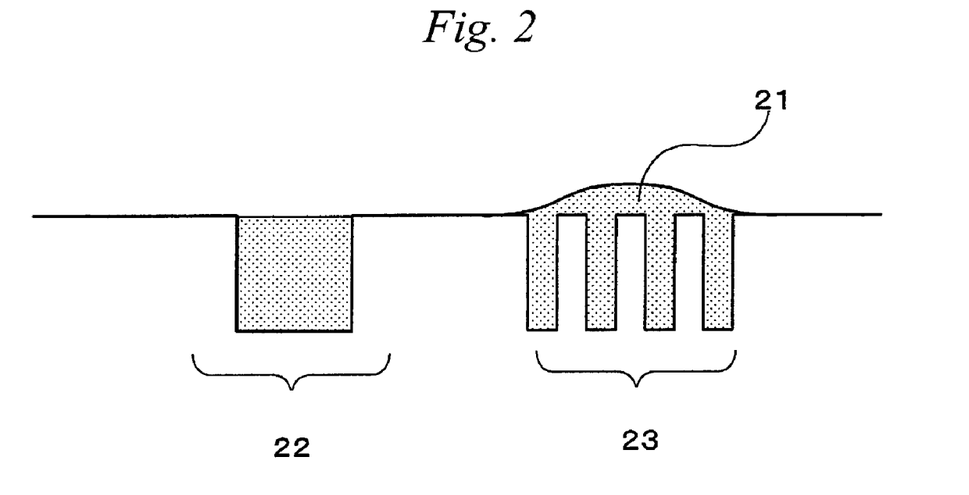
FIG. 2 is a cross-sectional view schematically showing a state that copper remaining is present on a portion having high wiring density.
Figure 3:
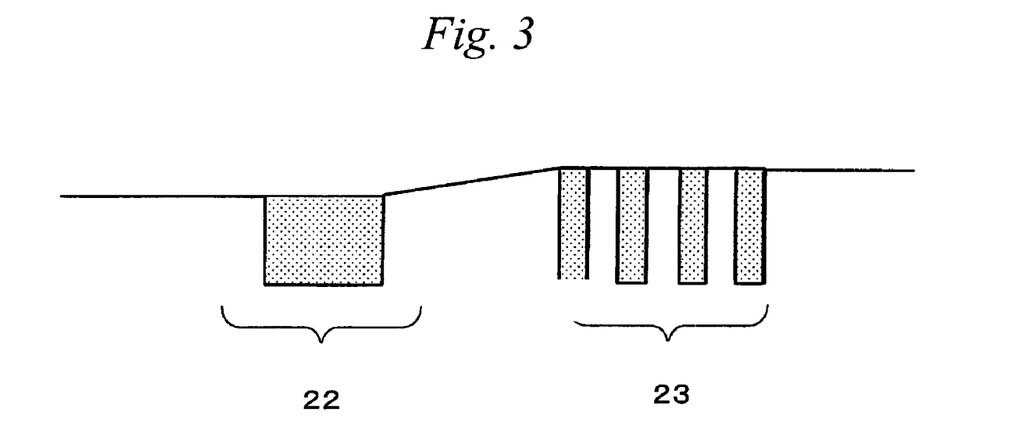
FIG. 3 is a cross-sectional view schematically showing a state after the cross-section of the state of FIG. 2 was subjected to a second polishing step.

In this case, in the pattern formation of polishing a copper layer provided on an insulating layer through a barrier layer thereby alternately forming a copper-embedded wiring and the insulating layer, remaining of copper on the barrier layer (copper remaining) and pits (depression) on the copper wiring become the problem as irregularity on the surface, in the stage until the barrier layer adjacent to the copper layer is exposed (first polishing step).

Where copper remaining occurs, the portion becomes a raised state as compared with the portion free of the copper remaining, and in the subsequent second polishing step, the state is liable to be maintained as it is. As a result, irregularity is easy to cause on the surface. FIG. 1 is a cross-sectional view schematically showing the state that the portion having copper remaining 21 is raised as compared with the portion 22 free of copper remaining. The copper remaining is easy to occur in portions having high wiring density, and in such a case, there is a possibility that thickness of copper wiring of the portion is larger than that of other portion. The state is schematically shown in FIG. 2 and FIG. 3. FIG. 2 shows that copper remaining 21 is present in a portion 23 having high wiring density. In such a case, where the influence remains in the subsequent second polishing step, the thickness of the copper wiring in the portion 23 is liable to be increased as compared with the thickness of copper wiring of the portion 22 free of copper remaining. In FIG. 2 and FIG. 3, the description of the barrier layer is omitted.

Pits on the copper wiring are probably one kind of corrosion of copper, and are very fine as can be seen in a magnification of several ten thousands.

An abrasive using rosin is disclosed as a polishing composition for CMP used in the polishing of copper. However, this polishing composition could not completely deal with copper remaining and could not sufficiently reduce polishing rate of the barrier layer (for example, see Patent Document 1).

Other than the above, dishing and erosion described hereinafter are known as the problem of irregularity on a surface. The terms "planarization improvement" and "planarizing" hereinafter used mean that at least any one of dishing and erosion is improved.

BACKGROUND ART DOCUMENT

Patent Documents
Patent Document 1: WO2007/072918 (Claims)

SUMMARY OF THE INVENTION

Problems that the Invention is to Solve

The present invention has an object to provide a novel polishing composition that can solve the above problems. Other objects and advantages of the present invention will be apparent from the following description.

Means for Solving the Problems

According to embodiment 1 of the present invention, there is provided a polishing composition used in a step of polishing until a barrier layer adjacent to a copper layer is exposed, in a pattern formation of polishing the copper layer provided on an insulating layer through the barrier layer thereby alternately forming a copper embedded wiring and the insulating layer, the polishing composition comprising:

an alicyclic resin acid;

a colloidal silica in which a content thereof in the polishing composition is from 0.1 to 1.5% by mass, an average primary particle size thereof is from 10 to 40 nm, an average secondary particle size thereof is from 30 to 80 nm, and (the average secondary particle size×the content) is in a range of from 10 to 40; and tetramethylammonium ion.

According to embodiment 2 of the present invention, there is provided the polishing composition according to embodiment 1, further comprising potassium ion.

According to embodiment 3 of the present invention, there is provided the polishing composition according to embodiment 1 or 2, wherein a content of the tetramethylammonium ion in the polishing composition is from 0.1 to 1.4% by mass in terms of tetramethylammonium hydroxide.

According to embodiment 4 of the present invention, there is provided the polishing composition according to embodiment 2 or 3, wherein a content of the potassium ion in the polishing composition is 0.6% by mass or less in terms of potassium hydroxide.

According to embodiment 5 of the present invention, there is provided the polishing composition according to any one of embodiments 2 to 4, wherein a ratio of the tetramethylammonium ion/the potassium ion is 0.3 or more in terms of tetramethylammonium hydroxide/potassium hydroxide.

According to embodiment 6 of the present invention, there is provided the polishing composition according to any one of embodiments 1 to 5, wherein the alicyclic resin acid is rosin.

According to embodiment 7 of the present invention, there is provided the polishing composition according to any one of embodiments 1 to 6, further comprising an oxidizing agent.

According to embodiment 8 of the present invention, there is provided the polishing composition according to any one of embodiments 1 to 7, further comprising a complex forming agent.

According to embodiment 9 of the present invention, there is provided a method for producing a semiconductor integrated circuit device which comprises an insulating layer having a trench and a copper embedded wiring formed in the trench, the method comprising:

polishing a multilayered structure for the semiconductor integrated circuit device, comprising the insulating layer having formed thereon a barrier layer and a copper layer in this order, with the polishing composition according to any one of embodiments 1 to 8 until the barrier layer adjacent to the copper layer is exposed.

According to embodiment 10 of the present invention, there is provided the method for producing a semiconductor integrated circuit device according to embodiment 9, wherein the barrier layer comprises at least one selected from the group consisting of Ta, TaN, Ti, TiN and Ru.

According to embodiment 11 of the present invention, there is provided the method for producing a semiconductor integrated circuit device according to embodiment 9 or 10, wherein the multilayered structure comprises a cap layer between the insulating layer and the barrier layer.

According to embodiment 12 of the present invention, there is provided the method for producing a semiconductor integrated circuit device according to any one of embodiments 9 to 11, wherein the insulating layer having a trench is a silicon dioxide film or a film having a dielectric constant of 3 or less.

Advantage of the Invention

According to the present invention, there is obtained a novel polishing composition for a first polishing step, which can eliminate the problem of copper remaining and can suppress a polishing rate of a barrier layer, while maintaining good polishing rate of copper wiring in the first polishing step.

BRIEF DESCRIPTION OF THE DRAWINGS

FIGS. 4(a) to 4(c) are schematic cross-sectional views of a patterned wafer before and after CMP step in a copper embedded wiring formation step.

MODE FOR CARRYING OUT THE INVENTION

Action of the polishing composition according to the present invention is described below by reference to the case of polishing a copper film surface having trenches for wiring of a semiconductor integrated circuit. The present invention is described below focusing around the case of applying to a semiconductor integrated circuit device having copper wiring which is the particularly preferred use. However, it should be understood that the polishing composition according to the present invention can be used in other cases so long as it is a polishing composition for copper wiring polishing. Furthermore, the following description is to exemplify the present invention, and does not limit the scope of the present invention, and it is needless to say that other embodiments can belong to the scope of the present invention so long as the embodiment meets the gist of the present invention.

The polishing composition according to the present invention is a polishing composition until a barrier layer adjacent to a copper layer is exposed, that is, a polishing composition for a first polishing step, in the pattern formation of polishing the copper layer provided on an insulating layer through the barrier layer thereby alternately forming a copper embedded wiring and the insulating layer. Copper portion other than the copper wiring is removed in the first polishing step, the barrier layer is removed in a second polishing step, and additionally, in most cases, the insulating layer and if necessary, a part of copper, are extremely slightly polished, whereby a planarized surface comprising the insulating layer and the copper layer is formed.

<Materials Used>

Figure 4A:
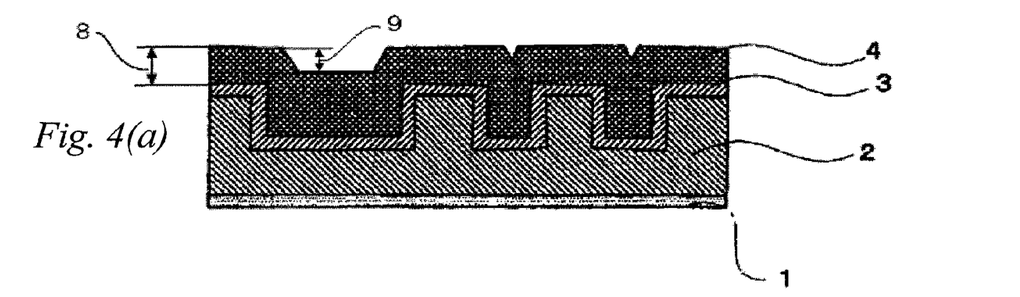
FIG. 4(a) is a cross-sectional view of a semiconductor integrated circuit before polishing.

Materials used in the present invention are described below. Schematic cross-section of a patterned wafer before polishing is shown in FIG. 4(a). In FIG. 4(a), an insulating layer 2, a barrier layer 3 and a wiring metal layer (copper layer) 4 are formed on an Si substrate 1.

<Insulating Layer>

As the insulating layer, all of an $SiO_2$ film by plasma CVD using tetraethoxysilane, silane or the like, a low dielectric material film (SiOF film, organic SOG film and the like), and structures of those combined with a cap layer can be mentioned.

Any conventional materials may be used as the material constituting the insulating layer which is one of the layers to be polished by the polishing composition according to the present invention. As such a material, a silicon dioxide film may be mentioned. A film comprising a crosslinked structure of Si and O in which the ratio of atomic number between Si and O is 1:2 is generally used as the silicon dioxide film, but films other than the above can be used. Films obtained by using tetraethoxysilane (TEOS) or silane gas ($SiH_4$) and depositing the same by plasma CVD are generally known as the silicon dioxide film.

In recent years, other than the silicon dioxide film, a film comprising a low dielectric material having a dielectric constant of 3 or less is becoming to be used for the purpose of suppressing signal delay. A film comprising fluorine-doped silicon oxide (SiOF), an organic SOG film (film containing an organic component obtained by Spin on glass), a low dielectric material film such as a porous film, and an organosilicon material (generally expressed as SiOC) film mainly constituted of Si—O bond and containing $CH_3$ bond are known the low dielectric material film. Those films can suitably be used as the insulating layer to which the polishing composition according to the present invention is applied.

The organosilicon material is an extension of the conventional technique as a process technique, and mass production technique having a wide application range has been achieved by conducting suitable process tuning. Therefore, the technique of planarizing a film using the low dielectric material film is demanded, and the polishing composition according to the present invention can be preferably used.

Examples of the organosilicon material as a low dielectric material include trade name: Black Diamond (dielectric constant: 2.7, manufactured by Applied Materials), trade name: Coral (dielectric constant: 2.7, manufactured by Novellus Systems), and Aurora 2.7 (dielectric constant: 2.7, manufactured by Japan ASM). Above all, a compound having Si—$CH_3$ bond is particularly preferably used.

<Cap Layer>

Figure 4B:
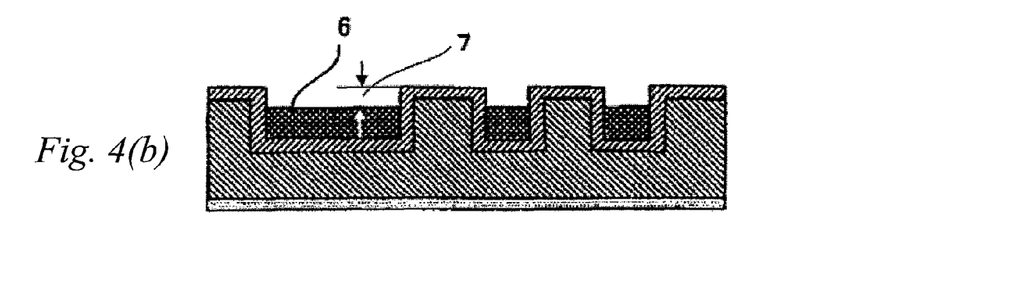
FIG. 4(b) is a cross-sectional view of a semiconductor integrated circuit having dishing caused by polishing.
Figure 4C:
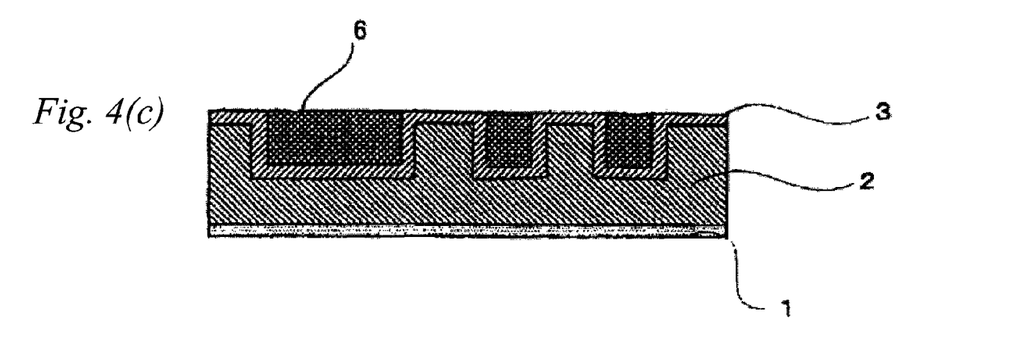
FIG. 4(c) is a cross-sectional view after polishing of a semiconductor integrated circuit that has ideally been polished.

Although not shown in FIG. 4, the polishing composition according to the present invention can be preferably used to the case that a cap layer is formed on the insulating layer. For example, the polishing composition can be applied to the case that in a multilayered structure comprising a low dielectric insulating layer having a cap layer, a barrier layer and a metal wiring layer sequentially formed thereon, the cap layer is completely removed, and the insulating layer is then shaven to planarize.

The cap layer is a layer provided for the purpose of increasing adhesion between the insulating layer and the barrier layer, using as a mask material in forming trenches for embedding the metal wiring layer in a chemically and mechanically brittle low dielectric insulating layer by etching, and attending alternation prevention of a low dielectric material, in the case of using a low dielectric material in the insulating layer.

In the case that SiOC which is a Low-k material is used as the insulating layer, a film comprising silicon and oxygen as constituent elements is generally used as the cap layer. Such a film can include a silicon dioxide film. A film comprising a crosslinked structure of Si and O in which the ratio of atomic number between Si and O is 1:2 is generally used as the silicon dioxide film, but films other than the above can be used. Films obtained by using tetraethoxysilane (TEOS) or silane gas ($SiH_4$) and depositing the same by plasma CVD are generally known as the silicon dioxide film.

<Barrier Layer>

The barrier layer is a layer comprising at least one selected from the group consisting of Ta, TaN, Ti, TiN and Ru, formed on the insulating layer by a sputter method, and is arranged for the purpose of preventing diffusion of copper from a copper layer to the insulating layer. In the present invention, the barrier layer plays a role of a stopper for finding out the time that the wiring part appears in the polishing of the copper layer.

<Copper Layer>

The copper layer is formed on the insulating layer through the barrier layer. The film formation method can include a method of film-forming a Cu seed layer by a sputter method in a thickness of about 100 nm after film formation of the barrier layer, and further forming a Cu layer on the Cu seed layer by an electroplating method.

According to the present invention, surface planarization having high precision can be realized in the case of using copper as a wiring metal. For this reason, a semiconductor integrated circuit having less dishing and erosion and having a surface state with excellent planarization can be obtained, and this is extremely useful for multilayering and line thinning of a semiconductor integrated circuit. This is described in further detail below.

Generally, in the case of polishing a wafer of a large diameter, non-uniformity of in-plane film thickness distribution and polishing pressure to a pad is unavoidable, and it is difficult to uniformly polish the in-plane entire surface. For this reason, when a copper layer provided on an insulating layer through a barrier layer is polished, the barrier layer adjacent to the copper layer on a part of the wafer plane is first exposed. When polishing (called overpolishing) is subsequently conducted in order to remove the copper layer of the barrier layer over the entire surface of the wafer, there was the problem in the polishing technique using the conventional abrasive that dishing of copper embedded wiring sequentially exposed proceeds.

Figure 5:
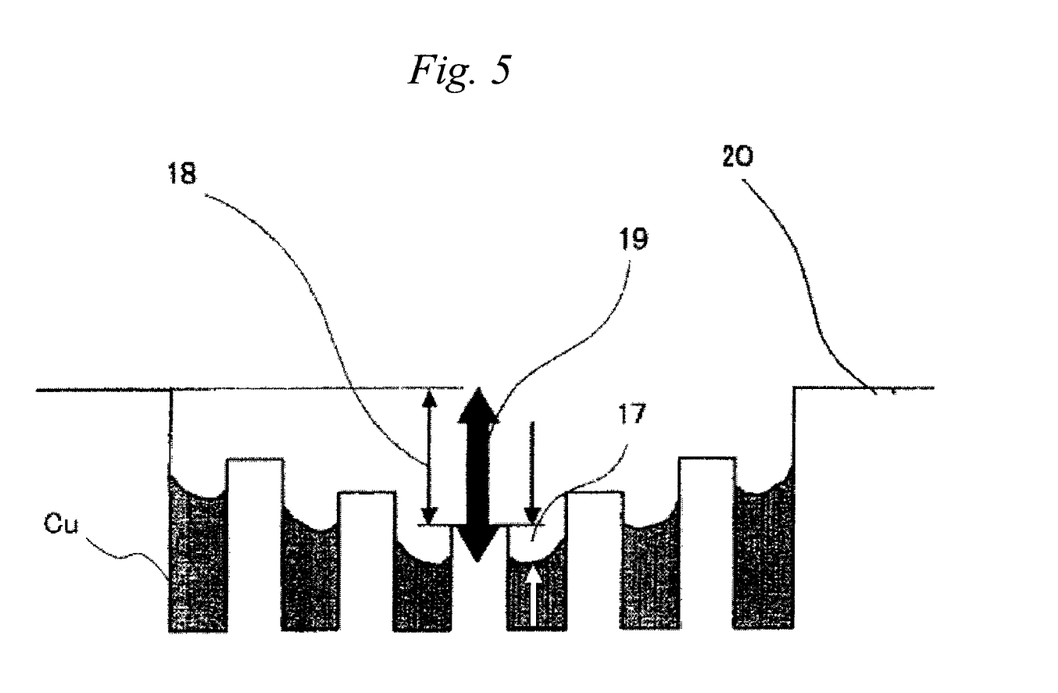
FIG. 5 is a schematic cross-sectional view of a patterned wafer for explaining erosion.

That is, the amount of dishing at the time that the barrier layer was exposed was large, the amount of dishing at the time that a first polishing step is finished and excess copper layer is removed by overpolishing was large, causing variations, and as the case may be, erosion occurred. For this reason, it was conventionally required in a second polishing step that after shaving the barrier layer, a part of the insulating layer and the copper wiring is further shaved to smoothly finish the copper wiring and the insulating layer. However, in case where the polishing amount in the second polishing step is increased, there was a concern that portions that depth of wiring trench is insufficient by the in-plane distribution of polishing, and dishing of copper wiring newly occurs. The erosion is easy to occur in a fine wiring part and a dense wiring part, and means a phenomenon that the insulating layer on the wiring part is excessively polished and the thickness of the insulating layer is partially decreased, as compared with the insulating layer portion (Global part) free of wiring pattern as shown in FIG. 5. That is, an erosion portion 18 which was further polished than a Global part 20 is formed. In FIG. 5, a barrier layer is omitted.

Contrary to this, when the polishing composition of the present invention is used, the copper wiring is not polished more than necessary by overpolishing. Therefore, in the first polishing step, the overpolishing can be conducted in good time without the progress of dishing and the occurrence of erosion. As a result, even in a wafer having a large diameter of 8 inches or more, remarkable effect can be obtained that excess copper layer is removed smoothly and uniformly over the wafer in-plane entire surface by overpolishing, so that the amount of dishing at the time of completion of the first polishing step can be 55 nm or less.

Furthermore, because the insulating layer and the copper layer are not excessively shaved in the second polishing step, the thickness of the insulating layer and the copper layer can be decreased and the amount of trench processing (shaved amount of trench of wiring) can be decreased, thereby reducing the polishing amount. By this, the overall steps can be conducted in a short period of time, making it possible to reduce costs, and the effect that variation of trench depth of wiring and dishing of the copper wiring can be suppressed is obtained.

<Polishing Composition>

Various materials that can be used in the polishing composition of the present invention are described below.

<Complex Forming Agent>

The polishing composition may contain a complex forming agent. The complex forming agent means a substance which forms a complex with copper. By containing the complex forming agent, polishing rate of copper is increased although the mechanism is not clear. Specific examples of the complex forming agent are described below:

Carboxylic acid (monocarboxylic acid and polycarboxylic acid) having nitrogen-containing heterocyclic group: 2-pyridinecarboxylic acid, 3-pyridinecarboxylic acid, 4-pyridinecarboxylic acid, 2,3-pyridinedicarboxylic acid, 2,4-pyridinedicarboxylic acid, 2,5-pyridinedicarboxylic acid, 2,6-pyridinedicarboxylic acid, 3,4-pyridinedicarboxylic acid, 3,5-pyridinedicarboxylic acid, pyradinecarboxylic acid, 2,3-pyradinedicarboxylic acid, 2-quinolinecarboxylic acid (quinaldic acid), 3-quinolinecarboxylic acid, 4-quinolinecarboxylic acid and 8-quinolinecarboxylic acid;

Carboxylic acid having amino group (amino acid and the like): alanine, glycine, proline and phenylalanine;

Carboxylic acid having hydroxyl group (hydroxycarboxylic acid and the like): lactic acid, malic acid, citric acid, isocitric acid, tartaric acid, glycolic acid, gluconic acid and salicylic acid;

Polycarboxylic acid other than the above: oxalic acid, malonic acid, succinic acid, fumaric acid, maleic acid, oxalacetic acid, glutaric acid, adipic acid, citraconic acid, itaconic acid, diglycolic acid, thiodiglycolic acid and phthalic acid;

Carboxylic acid having thiol group: thioglycolic acid and thiosalicylic acid.

The complex forming agent is preferably polycarboxylic acid or monocarboxylic acid, having nitrogen-containing heterocyclic group, or aliphatic polycarboxylic acid such as oxalic acid, and particularly preferably 2-pyridinecarboxylic acid and 2,3-pyridinecarboxylic acid. By using carboxylic acid having nitrogen-containing heterocyclic ring, such as 2-pyridinecarboxylic acid, polishing rate of copper is particularly increased, and additionally, the effect that adhesion and retention of copper complex and the like onto a polishing pad are prevented is exhibited.

The content of the complex forming agent in the polishing composition of the present invention is preferably from 0.1 to 5% by mass, particularly preferably from 0.3 to 3% by mass, and further preferable from 0.5 to 1.5% by mass, based on the polishing composition. When the content thereof is less than 0.1% by mass, there is a concern that polishing rate of copper is decreased. When the content thereof exceeds 5% by mass, there is a concern that corrosion and dishing occur on the surface of copper.

<Alicyclic Resin Acid>

The polishing composition contains an alicylic resin acid. The resin acid is an organic acid (carboxylic acid) present in natural resin in a free form or in the form of an ester, and an alicyclic resin acid means a compound having an alicyclic structure in the resin acid (see Chemical Dictionary 4, the item of "Resin Acid", published by Kyoritsu Shuppan Co., Ltd.). Examples of the alicyclic resin acid in the present invention include natural resin containing alicyclic resin acid, a purified resin acid comprising, as the main component, alicyclic resin acid purified (isomerization and the like may simultaneously occur) from natural resin, alicyclic resin acid that is a single compound extracted from natural resin, and a mixture of two kinds or more of those.

Examples of the purified resin acid include rosin obtained from pine resin, tall oil, and tall oil resin. In particular, a purified resin acid called "rosin" comprising, as the main component, abietic acid or its isomer, pimaric acid or its isomer, or hydrogenated abietic acid is preferred, and the commercial available rosin can be used as the alicyclic resin acid in the present invention. The rosin is that the compound contained therein and its compositional proportion vary depending on the kind of natural resin from which the rosin is derived, but any kind of rosin can be used so long as the rosin comprises alicyclic resin acid as the main component.

The commercially available rosin sometimes contains a small amount of aliphatic resin acid. The aliphatic resin acid is mainly an unsaturated higher fatty acid such as oleic acid or linoleic acid, and its content is generally about 10% by mass based on the whole rosin.

Examples of the alicyclic resin acid which is a single compound include abietic acid, neoabietic acid which is an isomer of abietic acid, palustric acid, levopimaric acid, dihydroabietic acid or tetrahydroabietic acid which is a hydride of abietic acid, and dehydroabiectic acid or secodehydroabiectic acid which is a dehydride of abietic acid. Other examples include pimaric acid, isopimaric acid, sandaracopimaric acid, communic acid and dihydroagathenic acid.

The polishing composition may contain two kinds or more of the alicyclic resin acid. The purified resin acid such as rosin is originally a mixture of two kinds or more alicyclic resin acid (single compound), but it is considered in the present invention to be one kind of alicyclic resin acid. Therefore, the polishing composition may contain two kinds or more of rosin, and may contain the rosin and one kind or more of alicyclic resin acid which is a single compound.

The alicyclic resin acid is the purified resin acid or a derivative of the alicyclic resin acid which is a single compound, and may be a compound having at least one carboxyl group or a mixture containing the same. Examples of the derivative include an isomerizate, a hydride, a dehydride, a polymerizate, and a modified product obtained by Diels-Alder addition of an unsaturated compound (unsaturated carboxylic acid or its anhydride, such as maleic anhydride, fumaric acid or acrylic acid) to an unsaturated group of alyciclic resin acid. At least one selected from the group consisting of maleic anhydride adduct (maleic acid-modified product), fumaric acid adduct (fumaric acid-modified product) and a dehydride is preferred. The dehydride includes a compound in which a part of an alicycle is converted into an aromatic ring.

It is preferred that the content of abietic acid (including neoabietic acid which is an isomer of abietic acid, dihydroabietic acid or tetrahydroabietic acid which is a hydride of abietic acid, dehydride of abietic acid, and the like) is from 0.005 to 5% by mass, further from 0.005 to 2% by mass, from 0.01 to 0.5% by mass, and from 0.01 to 0.1% by mass, in the polishing composition, since the surface of copper can effectively be protected.

The alicyclic resin acid includes a salt of the alicyclic resin acid. The salt of the alicyclic resin acid is preferably an alkali metal salt (particularly, potassium salt) of rosin which is also called "rosin", an ammonium salt of rosin, an organic amine salt of rosin. The salt of the alicyclic resin acid which is a single compound includes the following salts, and mixtures of two kinds or more thereof can be used: potassium salt of abietic acid, potassium salt of dehydroabietic acid, potassium salt of tetrahydroabietic acid, potassium salt of dihydroabietic acid, potassium salt of pimaric acid, ammonium salt of abietic acid, ammonium salt of dehydroabietic acid, ammonium salt of tetrahydroabietic acid, ammonium salt of dihydroabietic acid, ammonium salt of pimaric acid, organic amine salt of abietic acid, organic amine salt of dehydroabietic acid, organic amine salt of tetrahydroabietic acid, organic amine salt of dihydroabietic acid and organic amine salt of pimaric acid.

In the polishing composition, the effect of suppressing the amount of dishing is obtained by containing the alicyclic resin acid. The mechanism that the effect is obtained is not clear, but it is considered that the alicyclic resin acid induces any chemical action or physical action with the surface of a semiconductor integrated circuit copper film, and acts as a surface protecting agent which forms a protective layer on the surface of the copper film. The surface protective layer is not so strong to completely disturb polishing of the copper film. In the copper film on the semiconductor integrated circuit substrate, polishing proceeds in a convex portion at which pressing pressure of the polishing pad is large, and polishing does not proceed in a concave portion at which the pressing pressure is small. As a result, it is considered that polishing surface property of high smoothness is realized.

The content of the alicyclic resin acid in the polishing composition is preferably from 0.005 to 5% by mass, more preferably from 0.01 to 1% by mass, and further preferably from 0.01 to 0.5% by mass. When the content thereof is less than 0.005% by mass, it is considered that the action of protecting the surface of the copper film is insufficient, and corrosion and dishing are easy to occur during polishing. When the content thereof exceeds 5% by mass, there is a concern that polishing rate of copper is decreased.

The content ratio (mass ratio) between the complex forming agent and the alicyclic resin acid is preferably from 50:1 to 10:1, and particularly preferably from 40:1 to 10:1, from the standpoint that the polishing rate can be made good.

<Oxidizing Agent>

The oxidizing agent plays a role of oxidizing a metal such as copper to form metal ion or an oxide, although the mechanism is not clear. It is considered that copper ion formed by the reaction of the oxidizing agent and the complex forming agent form a complex, thereby the polishing proceeds.

The oxidizing agent can be added to the polishing composition of the present invention. Peroxide having oxygen-oxygen bond that generates radicals due to the dissociation of the oxygen-oxygen bond by external energy such as heat or light shows high oxidizing force, and is therefore preferred as the oxidizing agent. Examples of the peroxide oxidizing agent include inorganic peroxides such as hydrogen peroxide, persulfates, peroxocarbonates, peroxosulfates and peroxophosphates, and organic peroxides such as benzoyl peroxide, t-butylhydroperoxide, cumene hydroperoxide, diisopropylbenzene hydroperoxide, performic acid and peracetic acid. The preferred oxidizing agent is hydrogen peroxide, ammonium persulfate or potassium persulfate. Of those oxidizing agents, when ammonium salts, particularly ammonium persulfate, are used, high polishing rate to the copper film is obtained, and this is more preferred. The next preferred oxidizing agent is hydrogen peroxide and potassium persulfate.

The content of the oxidizing agent is desirably from 0.1 to 5% by mass, and particularly desirably from 0.5 to 3% by mass, based on the polishing composition. When the content thereof is less than 0.1% by mass, there is a concern that polishing rate of copper is decreased. When the content thereof exceeds 5% by mass, corrosion on the copper surface and dishing are easy to occur. In order to polish the copper film in high speed while suppressing dishing, it is preferred to use at least one kind selected from ammonium persulfate, hydrogen peroxide and potassium persulfate. It is particularly preferred to use ammonium persulfate.

<Water>

Main liquid medium in the polishing composition of the present invention is water, and preferably consists of water or comprises a mixture of water and a water-soluble solvent. Pure water obtained by ion-exchanging water to remove foreign matters is preferably used as water. Water-soluble alcohol, water-soluble polyol, water-soluble ester, water-soluble ether and the like can be used as the water-soluble solvent. The liquid medium in the polishing composition of the present invention is preferably water only or a mixed solvent of 80% by mass or more of water and a water-soluble organic solvent, and the liquid solvent consisting essentially of water is most preferred. The proportion of the liquid solvent in the polishing composition of the present invention is preferably 90% by mass or more, and particularly preferably 95% by mass or more. The substantially whole amount of the liquid solvent is preferably water, and in this case, the content of water in the polishing composition of the present invention is preferably 90% by mass or more, and particularly preferably 95% by mass or more.

The proportion of each component of the polishing composition of the present invention means the compositional proportion when the polishing is conducted.

In the case of diluting the polishing concentrated composition prior to polishing and using the diluted product in the polishing, the proportion of each component described above and described hereinafter is the proportion in the diluted product. The polishing concentrated composition is generally diluted with a liquid solvent (particularly water), and in the case, the relative proportion of each component excluding the liquid medium does not generally change before and after the dilution.

<Tetramethylammonium Ion>

It became clear that when the polishing composition contains the alicyclic resin acid, a colloidal silica in which the content thereof in the polishing composition is from 0.1 to 1.5% by mass, an average primary particle size thereof is from 10 to 40 nm, an average secondary particle size thereof is from 30 to 80 nm, and (the average secondary particle size×the content) is in a range of from 10 to 40 (unit: nm×% by mass), and tetramethylammonium ion, polishing rate of a barrier layer is suppressed while maintaining good polishing rate of copper wiring in a first polishing step. Probably this is considered due to that because the tetramethylammonium ion has a bulky steric structure, cationic tetramethylammonium ion adsorbs on the surface of colloidal silica negatively charged under alkaline property, thereby sufficiently decreasing grinding force to the barrier layer, while maintaining requisite minimum grinding force for copper polishing. The ratio of polishing rate of copper layer/polishing rate of the copper layer is preferably 150 or more.

The tetramethylammonium ion is obtained by adding tetramethylammonium hydroxide to the polishing composition. Counterion of the tetramethylammonium ion is not particularly limited, but is preferably selected in view of final pH, in order that the tetramethylammonium compound itself functions as a pH regulator described hereinafter. The tetramethylammonium compound generally includes tetramethylammonium hydroxide (TMAH).

It became clear that the content of the tetramethylammonium ion in the polishing composition is preferably from 0.1 to 1.4% by mass, and particularly preferably from 0.2 to 1.2% by mass, in terms of tetramethylammonium hydroxide. When the content thereof is less than 0.1% by mass, the ratio of the polishing rate of the barrier layer to copper (copper polishing rate/barrier layer polishing rate) is decreased by increasing of the polishing rate of the barrier layer. As a result, in pattern wafer, the thickness of the barrier layer is decreased or the barrier layer is removed, and exposure of the substrate insulating film layer is easy to occur.

When the content thereof exceeds 1.4% by mass, decrease in copper polishing rate and copper remaining are easy to occur by the generation of corrosion of a copper film due to pH rise of the polishing composition and great decrease in grinding force.

<pH Regulator>

It is preferred that the pH value of the polishing composition of the present invention is preferably from 7.5 to 12, particularly preferably from 8 to 11, and further preferably from 8.5 to 10.5. More preferred pH is from 9 to 10. When the pH value thereof is lower than 7.5, there is a concern that the alicyclic resin acid contained in the polishing composition of the present invention separates in the polishing composition, making heterogeneous. It is preferred that the pH value is 8.0 or more in order to polish copper in high rate. When the pH value thereof is higher than 12, corrosion of the copper film is remarkable, which is not preferred. It is preferred that the pH value is 11 or less in order to sufficiently suppress copper film remaining and corrosion of the copper film.

The pH regulator can be used in order to adjust the polishing composition of the present invention to have the above pH value. In the case of adjusting to a basicity side, it is preferred to use potassium hydroxide and other potassium compounds, organic amine and ammonia. Any one of those may be used, but when organic amine or ammonia which forms complex ion with copper is used, large polishing rate to the copper film is obtained, which is preferred. The pH may be once adjusted to basicity side than the desired pH value and then adjusted to acidity side by adding nitric acid, sulfuric acid, phosphorus acid or the like, thereby adjusting to the desired pH value.

The other potassium compound is not particularly limited, and can appropriately be selected from the conventional compounds. Examples thereof generally include potassium carbonate and potassium acetate.

In a series of steps of preparing the polishing composition of the present invention, the order of the step of mixing the pH regulator is not limited. When the alicyclic resin acid or the like is contained without converting into its salt in advance, if the pH regulator is mixed with the liquid medium to prepare a basic liquid medium (a part or the whole of other components may already be contained), dissolution and mixing of the alicyclic resin acid and the like become easy, and additionally separation is difficult to occur, which is preferred.

<Potassium Ion>

In the polishing composition, when potassium ion is concurrently present in addition to the tetramethylammonium ion, it is effective to increase the degree of concentration of the abrasive. In the field of the polishing composition, needs of concentrating the polishing composition and using the same are very high. Therefore, this effect is great.

The potassium ion is obtained by adding potassium hydroxide and other potassium compounds to the polishing composition. Counterion of potassium in the potassium compound is not particularly limited. However, because the potassium compound itself functions as the pH regulator, it is preferred to select the counterion in view of the final pH. The potassium compounds that can be used are as described above. It is needless to say that the potassium ion itself may not be one attributable to the pH regulator.

The content of the potassium ion in the polishing composition is preferably 0.6% by mass or less in terms of potassium hydroxide. When the content thereof exceeds 0.6%, there is the tendency that the suppressing effect of copper remaining and the suppressing effect of a barrier layer become insufficient. When the content thereof is less than 0.1%, the effect of suppressing copper remaining and the effect of suppressing a barrier layer are sufficiently obtained, but there is the tendency that the degree of concentration of the polishing composition is decreased. From the standpoint of concentration of the polishing composition, it is more preferred that the potassium ion is contained in an amount of 0.2% or more.

The ratio of tetramethylammonium ion/potassium ion is preferably 0.3 or more, and more preferably 3 or more, in mass ratio in terms of tetramethylammonium hydroxide/potassium hydroxide. When the ratio is a range of 0.3 or more, both sufficient suppressing effect of polishing rate of the barrier layer and sufficient elimination effect of copper remaining are easy to be obtained.

<Abrasive Grain>

The abrasive grain incorporated in the polishing composition of the present invention is colloidal silica. The colloidal silica is more excellent among silicas in view of dispersibility, stability, polishing force and the like.

The colloidal silica has an average primary particle size of from 10 to 40 nm, and an average secondary particle size of from 30 to 80 nm. When the average secondary particle size thereof exceeds 80 nm, the diameter of the abrasive grain is too large, and it is difficult to increase the concentration of the abrasive grain. When the diameter thereof is less than 30 nm, it is difficult to improve the polishing rate. The diameter is preferably a range of from 30 to 70 nm.

The abrasive grain has a specific surface area in a range of preferably from 30 to 300 $m^2/g$, and more preferably from 60 to 260 $m^2/g$. When the specific surface area thereof is less than 30 $m^2/g$, the average primary particle size is too large. When the specific surface area thereof exceeds 300 $m^2/g$, the primary particle size is too small. Sufficient polishing rate is obtained when the average primary particle size of the abrasive grain is not too small, and smooth and planarized polishing surface is obtained when the average primary particle size is not too large.

The content of the abrasive grain to the polishing composition of the present invention is that the content thereof in the polishing composition is from 0.1 to 1.5% by mass from the standpoint that both copper remaining and polishing rate can be achieved by the action in combination with tetramethylammonium ion, and it became clear that colloidal silica having an average primary particle size of from 10 to 40 nm, an average secondary particle size of from 30 to 80 nm, and (average secondary particle size×content) of from 10 to 40 (unit: nm×% by mass) is preferred.

The content of the abrasive grain is more preferably from 0.1 to 0.75% by mass, and the (average secondary particle size×content) is more preferably a range of from 10 to 25.

Regarding the polishing rate, copper is that chemical action is dominant. Contrary to this, in the polishing of the barrier layer in which mechanical action is dominant, the polishing rate depends on abrasive grain size, and it is considered there is the tendency that polishing rate becomes slow with decreasing the abrasive grain size and the polishing rate is increased with increasing the abrasive grain size. Regarding copper layer remaining in polishing, the copper remaining depends on an average secondary particle size, and it is considered there is the tendency that the copper remaining is easy to occur with decreasing the size and the copper remaining is difficult to occur with increasing the size. Therefore, in order to eliminate copper remaining, maintain polishing rate of the copper layer, and reduce polishing rate of the barrier layer, the condition of the (average secondary particle size×content) is necessary. The reason for this is probably considered that if the concentration is high even if the average secondary particle size is small, the same effect as the case that the average secondary particle size is larger appears, and on the other hand, if the concentration is low even if the average secondary particle size is large, the same effect as the case that the average secondary particle size is smaller appears. When any one of the above elements is fallen outside the lower limit and the upper limit of the respective ranges, polishing rate of the barrier layer is increased or the problem of copper remaining occurs.

<Corrosion Inhibitor>

The polishing composition preferably contains a corrosion inhibitor. Specifically, the corrosion inhibitor is preferably an imidazole derivative from the standpoint that pit can be prevented. The imidazole derivative is specifically imidazole and a derivative of imidazole in which 1- to 5-positions shown in the following formula may be substituted with a methyl group, and 4- and 5-positions may be a part of a benzene ring which may have a substituent.

[Chem. 1]

The imidazole derivative specifically includes benzimidazole, imidazole, 1-methylimidazole, 2-methylimidazole, 4-methylimidazole and 1,2-dimethylimidazole. Those may be used alone or by mixing two kinds or more thereof. The imidazole derivative is contained in an amount of preferably from 0.001 to 0.5% by mass, and more preferably from 0.003 to 0.3% by mass, based on the total mass of the polishing composition, from the standpoint of polishing property.

<Other Component>

Other than the above components, a reducing agent, a viscosity regulator, a dispersant, a preservative and the like can be incorporated in the polishing composition used in the polishing method of the present invention so long as the gist of the present invention is not impaired. However, the content of those is generally preferably 10% by mass or less, particularly preferably 5% by mass or less, and further preferably 3% by mass or less, in the total amount.

The polishing composition thus constituted can solve the problem of copper remaining while maintaining good polishing rate of copper wiring in the first polishing step, and additionally suppresses polishing rate of a barrier layer. As a result, a semiconductor integrated circuit surface having excellent planarized surface state can be obtained, and this is very effective to multilayering and line thinning of a semiconductor integrated circuit.

The polishing composition of the present invention is preferred in that its viscosity is low. The viscosity is an important element more than expected in the technical field such as CMP. The reason is that it is very important to make polishing conditions constant in order to conduct stable polishing. However, when the viscosity of the polishing composition is too high, there are possibilities that the abrasive is clogged and the abrasive remains, in a transportation system. Therefore, whether the polishing can be conducted under the same conditions over a long period of time greatly depends on the viscosity of the abrasive. To make the viscosity good, it is preferred that the polishing composition does not contain a water-soluble polymer. Specifically, when the content of the water-soluble polymer in the polishing composition is preferably 0.1% by mass or less, particularly preferably 0.05% by mass or less, and further preferably 0.03% by mass or less, the polishing rate can be prevented from decreasing more than necessary. The water-soluble polymer means a water-soluble polymer having a molecular weight of 5,000 or more.

The polishing composition of the present invention is suitable for polishing a copper film formed on the surface having a trench for wiring. The polishing composition of the present invention may be used as an abrasive by further adding other constituents. More specifically, the problem of copper remaining can be eliminated and polishing rate of a barrier layer is suppressed, while maintaining good polishing rate of copper wire. Therefore, progress of dishing and erosion are effectively suppressed in the production method of a semiconductor integrated circuit device which forms copper wiring by, for example, a damascene method. As a result, a semiconductor integrated circuit surface having excellent planarized surface state can be obtained.

<Polishing Method>

The polishing composition according to the present invention is preferably used in a polishing method for forming a pattern by polishing a copper layer provided on an insulating layer through a barrier layer, thereby alternately forming a copper-embedded wiring and the insulating layer, the method comprising a first polishing step of polishing with a first polishing composition which is the above-described polishing composition and a second polishing step of polishing with a second polishing composition in a pattern formation of polishing a copper layer provided on an insulating layer through a barrier layer, thereby alternately forming a copper embedded wiring and the insulating layer.

By the polishing method which separately uses those two kinds of polishing compositions, in the case of using copper as a wiring metal, excellent planarized surface having less dishing and erosion can be realized with good in-plane uniformity. This is extremely effective to multilayering and line thinning of a semiconductor integrated circuit.

It is generally preferred for the first polishing step and the second polishing step that the second polishing step is conducted just after the first polishing step, thereby completing the polishing. However, as the case may be, other step may be included between the first polishing step and the second polishing step, before the first polishing step, or after the second polishing step. The completion period of the first polishing step, and the initiation period and the completion period of the second polishing step are not particularly limited, and can appropriately be determined according to the actual condition of the polishing. It is generally preferred that when the copper layer provided on the insulating layer through the barrier layer has been removed other than the wiring, the first polishing step is stopped and the second polishing is then initiated, and when a desired surface planarization has been obtained, the second polishing is stopped. That is, when copper portion other than the copper wiring is removed in the first polishing step and the barrier layer is removed in the second polishing step, in many cases the insulating layer and as necessary, a part of copper, are extremely slightly polished, thereby a planarized surface comprising the insulating layer and the copper layer is formed.

EXAMPLES

The present invention is described below by reference to Examples, but the invention is not limited to the following description. Examples 6 to 11, 13 to 15, 17 to 20, 26 to 29, 31 to 34 and 39 to 42 are Working Examples, and Examples 1 to 5, 12, 16, 21 to 25, 30 and 35 to 38 are Comparative Examples.

Compositions of Examples 1 to 42 are shown in Tables 1 to 4. The content of the respective components is % by mass based on the whole polishing composition mixed. The pH value was measured with pH Meter, pH81-11, manufactured by Yokogawa Electric Corporation.

The average primary particle size of colloidal silica was obtained by calculating from specific surface area obtained by BET method.

The average secondary particle size of colloidal silica was measured with a dynamic light scattering method using Microtac UPA-ST150 Particle Analyzer, manufactured by Nikkiso Co., Ltd. The measurement sample was diluted with pure water to a proper concentration range defined in an apparatus, by which scattering and reflective light intensity appropriate for measurement, and then subjected to the measurement.

The polishing composition was prepared as follows. A given amount of 2-pyridinecarboxylic acid as a complex forming agent was added to ion-exchange water, and as necessary, potassium hydroxide and tetramethylammonium hydroxide as pH regulators shown in Tables 1 to 4 were added, followed by sufficiently stirring. While further stirring, KR614 (rosin containing about 80% of dehydroabietic acid), product name, manufactured by Arakawa Chemical Industries, Ltd., oleic acid as a planarization improver and APS (ammonium persulfate) as an oxidizing agent were added, and colloidal silica as abrasive grain was then added. Potassium hydroxide was only a supply source of potassium ion, and tetramethylammonium hydroxide was only a supply source of tetramethylammonium ion.

Polishing characteristics of the polishing composition were evaluated by the following methods.

Material to be Polished

Blanket wafer and patterned wafer were used as materials to be polished.

To evaluate polishing rate of copper wiring in the first polishing step, 8-inch wafer (000CUR015, manufactured by Sematech) comprising Si substrate having a copper film having a thickness of 1,500 nm formed thereon by wet plating was used as the blanket wafer.

For the evaluation of polishing rate of the barrier layer, 8-inch wafer (manufactured by Yamaichi Co., Ltd.) comprising Si substrate having a tantalum film having a thickness of 300 nm formed thereon by sputtering was used.

As the patterned wafer, 8-inch wafer (trade name: 854CMP225) manufactured by Sematech was used. Schematic cross-sectional view of the patterned wafer before polishing is shown in FIG. 4(a).

The patterned wafer is as follows. An insulating layer 2 comprising $SiO_2$ and having a concave portion in which embedding wiring is embedded and a convex portion is formed on an Si substrate 1. And a barrier layer 3 comprising a tantalum film having a thickness of 25 nm formed by sputtering method is formed on the insulating layer 2. Further, a wiring metal layer 4 comprising a 100 nm thick copper seed layer formed by a sputtering method and a copper film having a given film thickness by wet plating is laminated on the barrier layer 3. Wiring patterns having various widths of from 100 μm to 180 nm are formed.

<Evaluation of Polishing Characteristics>

Automatic CMP apparatus MIRRA, manufactured by APPLIED MATERIAL was used as a polishing machine. Two-layer pad IC 1400, XYK-groove (manufactured by Nitta Haas Incorporated) was used as a polishing pad, and conditioning was conducted using MEC100-PH3.5L (manufactured by Mitsubishi Materials Corporation).

The polishing was conducted under the conditions that supply rate of a polishing composition is 200 lm/min, the rotation numbers of a polishing head (Head) and polishing platen (Platen) are 123 rpm and 117 rpm, respectively, and a polishing pressure is 1.5 psi, that is, 10.4 kPa.

(1) Polishing Rate of Bare Film (Unpatterned Flat Film)

The measurements of copper polishing rate and tantalum polishing rate using a blanket wafer were conducted using a film thickness meter RS-75 (manufactured by KLA-Tencor). That is, film thickness before polishing and film thickness after polishing for 1 minute were measured for a blanket wafer of copper and a blanket wafer of tantalum, and copper polishing rate (nm/min) and tantalum polishing rate (nm/min) were obtained from the difference, respectively.

The copper polishing rate is preferably 400 nm/min or more, and the tantalum polishing rate is preferably 5 nm/min or less.

(2) Evaluation of Copper Remaining after Polishing

Polishing of a patterned wafer was conducted while monitoring the polishing end point by an optical polishing end point detecting method. That is, overpolishing corresponding to 20% of the polishing end point time was further conducted from the polishing end point at which decrease in reflectivity occurred by that a barrier layer comprising tantalum begins to be exposed with the progress of polishing is substantially stopped and becomes constant.

Thereafter, evaluation was made by SEM (scanning electron microscope) photograph. Specifically, accelerating voltage was 2 KV, it was examined over the entire surface at 2000-fold magnification as to whether copper remains in a portion between copper wires having a line width of 0.18 As a result of observation by three observers, the case that copper remaining was not observed at all was evaluated as "None", and the case that copper remaining was observed if only a little was evaluated as "Observed".

The evaluation results are shown in Tables 1 to 4.

TABLE 1

| No. | Example | Abrasive grain | | | | | Complex forming agent | | Oxidizing agent | |
| | | Kind | Concentration (wt %) | Primary particle size (nm) | Secondary particle size (nm) | Secondary particle size × concentration | Kind | Concentration (wt %) | Kind | Concentration (wt %) |
|---|---|---|---|---|---|---|---|---|---|---|
| 1 | Comparative Example | Colloidal silica | 0.2 | 24 | 50 | 10 | 2-Pyridinecarboxylic acid | 1 | APS | 1.5 |
| 2 | Comparative Example | Colloidal silica | 0.15 | 24 | 50 | 7.5 | 2-Pyridinecarboxylic acid | 1 | APS | 1.5 |
| 3 | Comparative Example | Colloidal silica | 0.1 | 24 | 50 | 5 | 2-Pyridinecarboxylic acid | 1 | APS | 1.5 |
| 4 | Comparative Example | Colloidal silica | 0.5 | 24 | 50 | 25 | 2-Pyridinecarboxylic acid | 1 | APS | 1.5 |
| 5 | Comparative Example | Colloidal silica | 1 | 24 | 50 | 50 | 2-Pyridinecarboxylic acid | 1 | APS | 1.5 |

TABLE 1-continued

| | | Abrasive grain | | | | Complex forming agent | | Oxidizing agent | |
|---|---|---|---|---|---|---|---|---|---|
| No. | Example | Kind | Concentration (wt %) | Primary particle size (nm) | Secondary particle size (nm) | Secondary particle size × concentration | Kind | Concentration (wt %) | Kind | Concentration (wt %) |
| 6 | Working Example | Colloidal silica | 0.375 | 24 | 50 | 18.75 | 2-Pyridinecarboxylic acid | 1 | APS | 1.5 |
| 7 | Working Example | Colloidal silica | 0.25 | 24 | 50 | 12.5 | 2-Pyridinecarboxylic acid | 1 | APS | 1.5 |
| 8 | Working Example | Colloidal silica | 0.25 | 24 | 50 | 12.5 | 2-Pyridinecarboxylic acid | 1 | APS | 1.5 |
| 9 | Working Example | Colloidal silica | 0.25 | 24 | 50 | 12.5 | 2-Pyridinecarboxylic acid | 1 | APS | 1.5 |
| 10 | Working Example | Colloidal silica | 0.25 | 24 | 50 | 12.5 | 2-Pyridinecarboxylic acid | 1 | APS | 1.5 |
| 11 | Working Example | Colloidal silica | 0.25 | 24 | 50 | 12.5 | 2-Pyridinecarboxylic acid | 1 | APS | 1.5 |
| 12 | Comparative Example | Colloidal silica | 0.05 | 24 | 50 | 2.5 | 2-Pyridinecarboxylic acid | 1 | APS | 1.5 |
| 13 | Working Example | Colloidal silica | 0.2 | 24 | 50 | 10 | 2-Pyridinecarboxylic acid | 1 | APS | 1.5 |
| 14 | Working Example | Colloidal silica | 0.5 | 24 | 50 | 25 | 2-Pyridinecarboxylic acid | 1 | APS | 1.5 |
| 15 | Working Example | Colloidal silica | 0.7 | 24 | 50 | 35 | 2-Pyridinecarboxylic acid | 1 | APS | 1.5 |
| 16 | Comparative Example | Colloidal silica | 1.2 | 24 | 50 | 60 | 2-Pyridinecarboxylic acid | 1 | APS | 1.5 |
| 17 | Working Example | Colloidal silica | 0.25 | 24 | 50 | 12.5 | 2-Pyridinecarboxylic acid | 1 | APS | 1.5 |
| 18 | Working Example | Colloidal silica | 0.25 | 24 | 50 | 12.5 | 2-Pyridinecarboxylic acid | 1 | APS | 1.5 |
| 19 | Working Example | Colloidal silica | 0.25 | 24 | 50 | 12.5 | 2-Pyridinecarboxylic acid | 0.75 | APS | 1.5 |
| 20 | Working Example | Colloidal silica | 0.25 | 24 | 50 | 12.5 | 2-Pyridinecarboxylic acid | 0.5 | APS | 1.5 |

TABLE 2

| | | Alicyclic resin acid | | Planarization improving agent | | pH Regulator | | TMAH | | Bare film polishing rate (Polishing pressure 1.5 psi) | | | |
|---|---|---|---|---|---|---|---|---|---|---|---|---|---|
| No. | Example | Kind | Concentration (wt %) | Kind | Concentration (wt %) | Kind | Concentration (wt %) | Concentration (wt %) | pH | Cu (nm/min) | Ta (nm/min) | Cu/Ta | Copper remaining |
| 1 | Comparative Example | Rosin | 0.04 | Oleic acid | 0.02 | KOH | 0.65 | 0 | 9.5 | 827 | 5.5 | 150 | None |
| 2 | Comparative Example | Rosin | 0.04 | Oleic acid | 0.02 | KOH | 0.65 | 0 | 9.5 | 810 | 4.3 | 188 | Observed |
| 3 | Comparative Example | Rosin | 0.04 | Oleic acid | 0.02 | KOH | 0.65 | 0 | 9.5 | 792 | 3.2 | 247 | Observed |
| 4 | Comparative Example | Rosin | 0.04 | Oleic acid | 0.02 | KOH | 0.65 | 0 | 9.5 | 827 | 9.7 | 85 | None |
| 5 | Comparative Example | Rosin | 0.04 | Oleic acid | 0.02 | KOH | 0.65 | 0 | 9.5 | 824 | 14.9 | 55 | None |
| 6 | Working Example | Rosin | 0.04 | Oleic acid | 0.02 | KOH | 0 | 1.2 | 9.5 | 827 | 3.2 | 258 | None |
| 7 | Working Example | Rosin | 0.04 | Oleic acid | 0.02 | KOH | 0 | 1.2 | 9.5 | 842 | 2.4 | 351 | None |
| 8 | Working Example | Rosin | 0.04 | Oleic acid | 0.02 | KOH | 0 | 1 | 9.3 | 738 | 2.2 | 336 | None |
| 9 | Working Example | Rosin | 0.04 | Oleic acid | 0.02 | KOH | 0.21 | 0.7 | 9.3 | 749 | 2.5 | 300 | None |
| 10 | Working Example | Rosin | 0.04 | Oleic acid | 0.02 | KOH | 0.3 | 0.7 | 9.5 | 818 | 2.4 | 341 | None |
| 11 | Working Example | Rosin | 0.04 | Oleic acid | 0.02 | KOH | 0.46 | 0.5 | 9.5 | 876 | 2.7 | 325 | None |
| 12 | Comparative Example | Rosin | 0.04 | Oleic acid | 0.02 | KOH | 0.21 | 0.85 | 9.5 | 785 | 1 | 785 | Observed |
| 13 | Working Example | Rosin | 0.04 | Oleic acid | 0.02 | KOH | 0.21 | 0.85 | 9.5 | 855 | 2 | 407 | None |
| 14 | Working Example | Rosin | 0.04 | Oleic acid | 0.02 | KOH | 0.21 | 0.85 | 9.5 | 865 | 3 | 264 | None |

TABLE 2-continued

| No. | Example | Alicyclic resin acid Kind | Concentration (wt %) | Planarization improving agent Kind | Concentration (wt %) | pH Regulator Kind | Concentration (wt %) | TMAH Concentration (wt %) | pH | Bare film polishing rate (Polishing pressure 1.5 psi) Cu (nm/min) | Ta (nm/min) | Cu/Ta | Copper remaining |
|---|---|---|---|---|---|---|---|---|---|---|---|---|---|
| 15 | Working Example | Rosin | 0.04 | Oleic acid | 0.02 | KOH | 0.21 | 0.85 | 9.5 | 864 | 5 | 184 | None |
| 16 | Comparative Example | Rosin | 0.04 | Oleic acid | 0.02 | KOH | 0.21 | 0.85 | 9.5 | 883 | 9 | 96 | None |
| 17 | Working Example | Rosin | 0.04 | Oleic acid | 0.015 | KOH | 0 | 1.2 | 9.5 | 931 | 2 | 396 | None |
| 18 | Working Example | Rosin | 0.04 | Oleic acid | 0.03 | KOH | 0 | 1.2 | 9.5 | 907 | 2 | 367 | None |
| 19 | Working Example | Rosin | 0.04 | Oleic acid | 0.02 | KOH | 0 | 0.9 | 9.3 | 734 | 2 | 312 | None |
| 20 | Working Example | Rosin | 0.04 | Oleic acid | 0.02 | KOH | 0 | 0.6 | 9.3 | 489 | 2 | 198 | None |

TABLE 3

| No. | Example | Abrasive grain Kind | Concentration (wt %) | Primary particle size (nm) | Secondary particle size (nm) | Secondary particle size × concentration | Complex forming agent Kind | Concentration (wt %) | Oxidizing agent Kind | Concentration (wt %) |
|---|---|---|---|---|---|---|---|---|---|---|
| 21 | Comparative Example | Colloidal silica | 0.05 | 34 | 70 | 3.5 | 2-Pyridinecarboxylic acid | 1 | APS | 1.5 |
| 22 | Comparative Example | Colloidal silica | 0.15 | 34 | 70 | 10.5 | 2-Pyridinecarboxylic acid | 1 | APS | 1.5 |
| 23 | Comparative Example | Colloidal silica | 0.2 | 34 | 70 | 14 | 2-Pyridinecarboxylic acid | 1 | APS | 1.5 |
| 24 | Comparative Example | Colloidal silica | 0.5 | 34 | 70 | 35 | 2-Pyridinecarboxylic acid | 1 | APS | 1.5 |
| 25 | Comparative Example | Colloidal silica | 0.9 | 34 | 70 | 63 | 2-Pyridinecarboxylic acid | 1 | APS | 1.5 |
| 26 | Working Example | Colloidal silica | 0.2 | 34 | 70 | 14 | 2-Pyridinecarboxylic acid | 1 | APS | 1.5 |
| 27 | Working Example | Colloidal silica | 0.2 | 34 | 70 | 14 | 2-Pyridinecarboxylic acid | 1 | APS | 1.5 |
| 28 | Working Example | Colloidal silica | 0.2 | 34 | 70 | 14 | 2-Pyridinecarboxylic acid | 1 | APS | 1.5 |
| 29 | Working Example | Colloidal silica | 0.2 | 34 | 70 | 14 | 2-Pyridinecarboxylic acid | 1 | APS | 1.5 |
| 30 | Comparative Example | Colloidal silica | 0.05 | 34 | 70 | 3.5 | 2-Pyridinecarboxylic acid | 1 | APS | 1.5 |
| 31 | Working Example | Colloidal silica | 0.2 | 34 | 70 | 14 | 2-Pyridinecarboxylic acid | 1 | APS | 1.5 |
| 32 | Working Example | Colloidal silica | 0.2 | 34 | 70 | 14 | 2-Pyridinecarboxylic acid | 1 | APS | 2 |
| 33 | Working Example | Colloidal silica | 0.2 | 34 | 70 | 14 | 2-Pyridinecarboxylic acid | 1 | APS | 1.5 |
| 34 | Working Example | Colloidal silica | 0.45 | 34 | 70 | 31.5 | 2-Pyridinecarboxylic acid | 1 | APS | 1.5 |
| 35 | Comparative Example | Colloidal silica | 1 | 34 | 70 | 70 | 2-Pyridinecarboxylic acid | 1 | APS | 1.5 |
| 36 | Comparative Example | Colloidal silica | 1.2 | 34 | 70 | 84 | 2-Pyridinecarboxylic acid | 1 | APS | 1.5 |
| 37 | Comparative Example | Colloidal silica | 0.25 | 11 | 34 | 8.5 | 2-Pyridinecarboxylic acid | 1 | APS | 1.5 |
| 38 | Comparative Example | Colloidal silica | 0.5 | 11 | 34 | 17 | 2-Pyridinecarboxylic acid | 1 | APS | 1.5 |
| 39 | Working Example | Colloidal silica | 0.5 | 11 | 34 | 17 | 2-Pyridinecarboxylic acid | 1 | APS | 1.5 |
| 40 | Working Example | Colloidal silica | 1 | 11 | 34 | 34 | 2-Pyridinecarboxylic acid | 1 | APS | 1.5 |
| 41 | Working Example | Colloidal silica | 0.25 | 24 | 50 | 12.5 | 2-Pyridinecarboxylic acid | 1 | APS | 1.1 |
| 42 | Working Example | Colloidal silica | 1 | 11 | 34 | 34 | 2-Pyridinecarboxylic acid | 1 | APS | 1.5 |

TABLE 4

| No. | Example | Alicyclic resin acid Kind | Concentration (wt %) | Planarization improving agent Kind | Concentration (wt %) | pH Regulator Kind | Concentration (wt %) | TMAH Concentration (wt %) | pH | Bare film polishing rate (Polishing pressure 1.5 psi) Cu (nm/min) | Ta (nm/min) | Cu/Ta | Copper remaining |
|---|---|---|---|---|---|---|---|---|---|---|---|---|---|
| 21 | Comparative Example | Rosin | 0.04 | Oleic acid | 0.02 | KOH | 0.65 | 0 | 9.5 | 678 | 2.2 | 308 | Observed |
| 22 | Comparative Example | Rosin | 0.04 | Oleic acid | 0.02 | KOH | 0.65 | 0 | 9.5 | 825 | 3.9 | 212 | Observed |
| 23 | Comparative Example | Rosin | 0.04 | Oleic acid | 0.02 | KOH | 0.65 | 0 | 9.5 | 830 | 5.6 | 148 | None |
| 24 | Comparative Example | Rosin | 0.04 | Oleic acid | 0.02 | KOH | 0.65 | 0 | 9.5 | 833 | 11.9 | 70 | None |
| 25 | Comparative Example | Rosin | 0.04 | Oleic acid | 0.02 | KOH | 0.65 | 0 | 9.5 | 842 | 17.9 | 47 | None |
| 26 | Working Example | Rosin | 0.04 | Oleic acid | 0.02 | KOH | 0.6 | 0.2 | 9.5 | 887 | 3.2 | 277 | None |
| 27 | Working Example | Rosin | 0.04 | Oleic acid | 0.02 | KOH | 0.5 | 0.35 | 9.5 | 863 | 2.6 | 332 | None |
| 28 | Working Example | Rosin | 0.04 | Oleic acid | 0.02 | KOH | 0.3 | 0.7 | 9.5 | 841 | 1.8 | 467 | None |
| 29 | Working Example | Rosin | 0.04 | Oleic acid | 0.02 | KOH | 0.21 | 0.85 | 9.5 | 809 | 1.2 | 674 | None |
| 30 | Comparative Example | Rosin | 0.04 | Oleic acid | 0.02 | KOH | 0 | 1.2 | 9.5 | 846 | 0.5 | 1692 | Observed |
| 31 | Working Example | Rosin | 0.04 | Oleic acid | 0.02 | KOH | 0 | 1.2 | 9.5 | 892 | 2.4 | 372 | None |
| 32 | Working Example | Rosin | 0.04 | Oleic acid | 0.02 | KOH | 0 | 1.2 | 9.5 | 900 | 2 | 566 | None |
| 33 | Working Example | Rosin | 0.04 | Oleic acid | 0.02 | KOH | 0.21 | 0.85 | 9.5 | 831 | 3 | 274 | None |
| 34 | Working Example | Rosin | 0.04 | Oleic acid | 0.02 | KOH | 0.21 | 0.85 | 9.5 | 847 | 5 | 180 | None |
| 35 | Comparative Example | Rosin | 0.04 | Oleic acid | 0.02 | KOH | 0.21 | 0.85 | 9.5 | 855 | 8 | 107 | None |
| 36 | Comparative Example | Rosin | 0.04 | Oleic acid | 0.02 | KOH | 0.21 | 0.85 | 9.5 | 861 | 14 | 61 | None |
| 37 | Comparative Example | Rosin | 0.04 | Oleic acid | 0.02 | KOH | 0.65 | 0 | 9.5 | 795 | 3 | 249 | Observed |
| 38 | Comparative Example | Rosin | 0.04 | Oleic acid | 0.02 | KOH | 0.65 | 0 | 9.5 | 771 | 7 | 112 | None |
| 39 | Working Example | Rosin | 0.04 | Oleic acid | 0.02 | KOH | 0.21 | 0.85 | 9.5 | 808 | 2.2 | 367 | None |
| 40 | Working Example | Rosin | 0.04 | Oleic acid | 0.02 | KOH | 0.21 | 0.85 | 9.5 | 798 | 3 | 266 | None |
| 41 | Working Example | Rosin | 0.06 | Oleic acid | 0.02 | KOH | 0.21 | 0.85 | 9.5 | 565 | 2 | 283 | None |
| 42 | Working Example | Rosin | 0.024 | Oleic acid | 0.01 | KOH | 0.21 | 0.85 | 9.5 | 878 | 3 | 293 | None |

In all of the Working Examples, copper remaining is not observed, and the polishing rate of the barrier layer was good as 5 nm/min or less. Furthermore, the ratio of (polishing rate of copper wiring)/(polishing rate of barrier layer) was good as 180 to 674.

Contrary to this, in Examples 1 to 5, 21 to 25, 37 and 38 (partially fallen outside the range of (average secondary particle size×content)), copper remaining occurred or the ratio of (polishing rate of copper wiring)/(polishing rate of barrier layer) was 179 or less.

It is understood from the results of Examples 4, 5, 22 to 24 and 37 that even though the elements of alicyclic resin acid and abrasive grain are satisfied, if THAM is not present, the ratio of (polishing rate of copper wiring)/(polishing rate of barrier layer) is insufficient.

In Example 12 in which the amount of colloidal silica and (average secondary particle size×content) are outside the lower limit, the ratio of (polishing rate of copper wiring)/(polishing rate of barrier layer) was increased, but copper remaining was observed.

Furthermore, in Examples 16, 35 and 36 in which (average secondary particle size×content) of colloidal silica is outside the upper limit, copper remaining is not observed, but the ratio of (polishing rate of copper wiring)/(polishing rate of barrier layer) was decreased.

In Example 30 in which potassium hydroxide is not added and (average secondary particle size×content) of colloidal silica is outside the lower limit, the ratio of (polishing rate of copper wiring)/(polishing rate of barrier layer) was increased, but copper remaining was observed.

In all of the Working Examples and the Comparative Examples, the dishing was 55 nm or less.

When the colloidal silica has the content thereof in the polishing composition of from 0.1 to 1.5% by mass, has the average primary particle size thereof of from 10 to 40 nm and the average secondary particle size thereof of from 30 to 80 nm, and has the (average secondary particle size×content) of in a range of from 10 to 40, the polishing rate of the barrier layer was suppressed while maintaining good polishing rate of copper wiring in the first polishing step.

Although the present invention has been described in detail and by reference to the specific embodiments, it is apparent to one skilled in the art that various modifications or changes can be made without departing the spirit and scope of the present invention.

This application is based on Japanese Patent Application No. 2008-287404 filed on Nov. 10, 2008 and Japanese Patent Application No. 2009-102942 filed on Apr. 21, 2009, the disclosures of which are incorporated herein by reference in their entities.

INDUSTRIAL APPLICABILITY

According to the present invention, a novel polishing composition for a first polishing step, that can eliminate the problem of copper remaining and suppresses the polishing arte of a barrier layer, while maintaining good polishing rate of copper wiring in the first polishing step is obtained.

DESCRIPTION OF REFERENCE NUMERALS AND SIGNS

1 Si substrate
2 Insulating layer
3 Barrier layer
4 Wiring metal layer
6 Copper-embedded wiring
7 Amount of dishing
8 Initial film thickness of copper film
9 Initial level difference of copper film
17 Dishing portion
18 Erosion portion
19 Greatest level difference
20 Global portion
21 Copper remaining
22 Part free of copper remaining
23 Part having high wiring density

The invention claimed is:

1. A polishing composition used in a step of polishing until a barrier layer adjacent to a copper layer is exposed, in a pattern formation of polishing the copper layer provided on an insulating layer through the barrier layer thereby alternately forming a copper embedded wiring and the insulating layer, the polishing composition comprising:
an alicyclic resin acid;
a colloidal silica in which a content thereof in the polishing composition is from 0.1 to 1.5% by mass, an average primary particle size thereof is from 10 to 40 nm, an average secondary particle size thereof is from 30 to 80 nm, and (the average secondary particle size×the content) is in a range of from 10 to 40; and
tetramethylammonium ion.

2. The polishing composition according to claim 1, wherein a content of the tetramethylammonium ion in the polishing composition is from 0.1 to 1.4% by mass in terms of tetramethylammonium hydroxide.

3. The polishing composition according to claim 1, wherein the alicyclic resin acid is rosin.

4. The polishing composition according to claim 1, further comprising an oxidizing agent.

5. The polishing composition according to claim 1, further comprising a complex forming agent.

6. The polishing composition according to claim 1, further comprising potassium ion.

7. The polishing composition according to claim 6, wherein a content of the potassium ion in the polishing composition is 0.6% by mass or less in terms of potassium hydroxide.

8. The polishing composition according to claim 6, wherein a ratio of the tetramethylammonium ion/the potassium ion is 0.3 or more in terms of tetramethylammonium hydroxide/potassium hydroxide.

9. A method for producing a semiconductor integrated circuit device which comprises an insulating layer having a trench and a copper embedded wiring formed in the trench, the method comprising:
polishing a multilayered structure for the semiconductor integrated circuit device, comprising the insulating layer having formed thereon a barrier layer and a copper layer in this order, with the polishing composition according to claim 1 until the barrier layer adjacent to the copper layer is exposed.

10. The method for producing a semiconductor integrated circuit device according to claim 9, wherein the barrier layer comprises at least one selected from the group consisting of Ta, TaN, Ti, TiN and Ru.

11. The method for producing a semiconductor integrated circuit device according to claim 9, wherein the multilayered structure comprises a cap layer between the insulating layer and the barrier layer.

12. The method for producing a semiconductor integrated circuit device according to claim 9, wherein the insulating layer having a trench is a silicon dioxide film or a film having a dielectric constant of 3 or less.

* * * * *